(12) United States Patent
Kantz et al.

(10) Patent No.: US 6,825,682 B2
(45) Date of Patent: Nov. 30, 2004

(54) TEST CONFIGURATION FOR THE FUNCTIONAL TESTING OF A SEMICONDUCTOR CHIP

(75) Inventors: Dieter Kantz, Hennigsdorf (DE); Jochen Müller, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/826,594

(22) Filed: Apr. 5, 2001

(65) Prior Publication Data

US 2001/0043078 A1 Nov. 22, 2001

(30) Foreign Application Priority Data

Apr. 5, 2000 (DE) .......................................... 100 16 996

(51) Int. Cl.[7] .............................................. G01R 31/28

(52) U.S. Cl. ...................................... 324/763; 324/765

(58) Field of Search ................................. 324/765, 763, 324/752, 501; 714/733, 734; 365/201

(56) References Cited

U.S. PATENT DOCUMENTS

| 5,130,645 | A |  | 7/1992 | Levy |  |
|---|---|---|---|---|---|
| 5,241,266 | A |  | 8/1993 | Ahmad et al. | 714/733 |
| 5,270,655 | A | * | 12/1993 | Tomita | 324/767 |
| 5,570,035 | A | * | 10/1996 | Dukes et al. | 324/763 |
| 5,764,655 | A | * | 6/1998 | Kirihata et al. | 714/733 |
| 6,058,497 | A | * | 5/2000 | Tuttle | 714/733 |
| 6,119,255 | A | * | 9/2000 | Akram | 714/734 |
| 6,300,785 | B1 | * | 10/2001 | Cook et al. | 324/765 |
| 6,331,782 | B1 | * | 12/2001 | White et al. | 324/763 |

FOREIGN PATENT DOCUMENTS

| EP | 0 551 564 A2 | 7/1993 |
|---|---|---|
| EP | 0 561 131 A2 | 9/1993 |
| EP | 0 805 356 A2 | 11/1997 |
| JP | 58-182444 | 12/1983 |
| JP | 2-110339 | 9/1990 |
| JP | 4 199 726 | 7/1992 |
| JP | 5-264672 | 10/1993 |
| JP | 6-84393 | 3/1994 |
| JP | 11 068 209 | 3/1999 |
| JP | 2000 048 131 | 2/2000 |
| JP | 2000 188 311 | 7/2000 |
| WO | 99/32893 | 7/1999 |

OTHER PUBLICATIONS

Prof. Dr. Claus Reuber: "Laserstrahl statt Prüfspitze" [laser beam instead of probe point], Elektronik, No. 24, (month available) 1997, pp. 96–102.

* cited by examiner

Primary Examiner—Ernest Karlsen
(74) Attorney, Agent, or Firm—Laurence A. Greenberg; Werner H. Stemer; Ralph E. Locher

(57) ABSTRACT

A test configuration for the functional testing of a semiconductor chip is described. The semiconductor chip, which can be subjected to a functional test for the purpose of checking the functionality of the semiconductor chip, is disposed on a support material. The semiconductor chip contains a self-test unit for generating test information and for carrying out the functional test. An energy source serves for providing an electrical energy supply from energy that is fed in contactlessly. The energy source is disposed on the support material and is connected to the semiconductor chip for the purpose of providing an energy supply on the semiconductor chip. The test configuration makes it possible to carry out a contactless functional test and to reduce the test costs by virtue of high parallelism during the functional test of a plurality of semiconductor chips.

13 Claims, 3 Drawing Sheets

TEST CONFIGURATION FOR THE FUNCTIONAL TESTING OF A SEMICONDUCTOR CHIP

BACKGROUND OF THE INVENTION

FIELD OF THE INVENTION

The present invention relates to a test configuration for the functional testing of a semiconductor chip that can be subjected to a functional test for the purpose of checking the functionality of the semiconductor chip.

In the course of the fabrication of semiconductor chips, the latter are generally subjected to at least one functional test, in which the functionality of the semiconductor chip is checked. In this case, the semiconductor chip is tested for example by an external test device that generates test information and carries out the functional test. In this case, the test information is read into the semiconductor chip and compared with data that are read out.

A functional check of an integrated semiconductor memory, for example, is usually performed in a number of steps. In a first test configuration, functional tests are performed on unpackaged semiconductor chips which are usually disposed on semiconductor wafers (referred to as wafer test or wafer-level test). These tests generally take place in complex test systems in parallel for a plurality of semiconductor chips, in order to keep the test time short and the test costs low. In a further test configuration, functional tests are performed on the packaged semiconductor chip (referred to as a module test).

In semiconductor memories, the test time and the test complexity generally rise significantly as the storage density increases, and hence the test costs and also the fabrication costs increase. When an external test unit is used for a wafer test, test signals, control signals and operating voltage and/or operating current are generally fed via a limited number of drive channels by what is referred to as needle card technology (referred to as probe cards). In this case, the number of memory chips that can be tested in parallel is limited on account of mechanically dictated problems in needle card technology for example for feeding in the operating voltage.

SUMMARY OF THE INVENTION

It is accordingly an object of the invention to provide a test configuration for the functional testing of a semiconductor chip which overcomes the above-mentioned disadvantages of the prior art devices of this general type, which enables the test time and the test costs for a functional test to be carried out to be kept comparatively short and low, respectively.

With the foregoing and other objects in view there is provided, in accordance with the invention, a test configuration. The test configuration contains a support material and a semiconductor chip disposed on the support material. The semiconductor chip has a self-test unit generating test information for functionally checking the semiconductor chip. An energy source is provided which supplies an electrical energy supply from energy that is fed in contactlessly. The energy source is disposed on the support material and is connected to the semiconductor chip for providing the electrical energy supply to the semiconductor chip.

The object is achieved by the test configuration for the functional testing of the semiconductor chip. The semiconductor chip, which can be subjected to a functional test for the purpose of checking the functionality of the semiconductor chip is disposed on the support material. The semiconductor has a self-test unit for generating test information and for carrying out the functional test, and an energy source for providing an electrical energy supply from energy that is fed in contactlessly. The energy source is disposed on the support material and is connected to the semiconductor chip for the purpose of providing an energy supply for the semiconductor chip.

The test configuration according to the invention makes it possible to test with regard to functionality, in parallel, an, in principle, arbitrarily high number of semiconductor chips to be tested. The self-test unit makes it possible, independently of an external test unit, to generate test information and to carry out a functional test. Thus, it is not necessary for the semiconductor chip that is to be tested to be contact-connected to an external test device via external terminals for test or control signals. Moreover, since an energy source for providing an electrical energy supply from energy that is fed in contactlessly is disposed on the support material, for example a semiconductor wafer, and is connected to the semiconductor chip. Therefore, external terminals for feeding in an operating voltage and/or an operating current can, moreover, be obviated. As a result, the number of semiconductor chips to be tested in parallel is no longer limited on account of mechanically dictated problems as for example in needle card technology. The test costs and fabrication costs are additionally lowered since an external test unit is not required.

If a plurality of semiconductor chips are disposed for example on the semiconductor wafer, than it is possible to subject not only the semiconductor chips of the semiconductor wafer but also a plurality of semiconductor wafers, or their applied semiconductor chips, to a parallel functional test. This can be carried out as a contactless wafer test by the test configuration according to the invention.

In a development of the invention, the energy source has at least one solar cell for generating an operating current on the semiconductor chip by optical radiation that is fed in contactlessly. For this purpose, the solar cell is irradiated with visible light, for example, thereby generating a current flow that serves as an operating current on the semiconductor chip.

In a test configuration in which a plurality of semiconductor chips to be tested are applied on a semiconductor wafer, in one embodiment the solar cell is disposed in the scribe line of the semiconductor wafer. The scribe line separates the semiconductor chips on the semiconductor wafer from one another. In a later fabrication process, the semiconductor chips are separated from one another along the scribe line by the semiconductor wafer being sawn along the scribe line (referred to as dicing). The requisite space needed on the semiconductor wafer can be utilized in an advantageous manner by disposing the solar cell in the scribe line. Since the solar cell is no longer required for later operation of the semiconductor chip, it is unimportant that it is destroyed during the later process of sawing through the semiconductor wafer.

In order to achieve adequate current generation by the solar cell, a relatively large area is needed for the solar cell. The scribe line is necessarily enlarged because of this, which means that the number of semiconductor chips on the semiconductor wafer can generally be reduced. This disadvantage must be balanced against the saving in test costs.

In a further embodiment of the invention, the solar cell is disposed areally on a surface of the semiconductor wafer on which the semiconductor chip to be tested is applied. With a 100% photon yield of the solar cell, the latter can be applied directly to the semiconductor wafer or the semiconductor chip. However, if the solar cell is light-transmissive, then it is expedient for a radiation-absorbing layer to be applied between the solar cell and the semiconductor chip, in order to avoid charge carrier generation on the chip.

In a further embodiment of the invention, the solar cell is disposed on that surface of the support material which is remote from the semiconductor chip to be tested. Thus, if the solar cell is disposed on the rear side of the support material, for example a semiconductor wafer, then a plated-through hole is needed from the solar cell through the substrate of the semiconductor wafer to the other side of the semiconductor wafer. At the boundary between the plated-through hole and the support material or the semiconductor wafer, a current barrier in the form of a pn junction is disposed along the plated-through hole in order to avoid a current flow between the plated-through hole and the semiconductor wafer. In order that the plated-through hole is configured in a simple manner, the semiconductor wafer may have to be thinned to the requisite extent. In the case of a partly transparent solar cell, it is necessary here, too, to dispose a radiation-absorbing layer between the solar cell and the semiconductor chip in order to prevent charge carrier generation.

In the event of using a solar cell for generating an energy supply on a semiconductor chip to be tested, it is generally necessary, for a given area, to generate an operating current with a magnitude sufficient to operate the semiconductor chip during the functional test. In general, no functional tests that are sensitive with regard to an operating frequency are carried out for the purpose of carrying out wafer tests. Therefore, the testing can in this case generally be effected at low operating frequencies. As a result, the operating current is kept comparatively low. The requirements made of the current driving capability of the solar cell are thus alleviated. During a test of a memory chip, for example, the total test time is given principally by the "retention tests" for the memory cells, and to a smaller proportion by the operating frequency itself. Moreover, since all the chips on a semiconductor wafer can be tested in parallel, a low operating frequency during a functional test is of scarcely any consequence.

The semiconductor chips can require a relatively large current in the event of a short circuit. In order to avoid a disturbance of a functional test, defective chips disposed on a semiconductor wafer are preferably decoupled from other functional chips of the semiconductor wafer with regard to the energy supply during the parallel test. This can be done by using, per semiconductor chip, a separate solar cell that is disposed on the semiconductor chip.

When a common energy source is used for the common current supply of a plurality of semiconductor chips to be tested, the chips to be tested each advantageously have a current limiter circuit for isolating a respective semiconductor chip from the energy source in the event of a limit value of an operating current is exceeded. If the current consumption of a chip to be tested lies above the limit value, for example in the event of a short circuit, the chip to be tested is not tested further and is isolated from the energy supply by the current limiter circuit.

In the interests of fabrication costs that are as low as possible, it is expedient that the process steps for producing or for depositing the solar cell can be integrated in the process steps for fabricating the semiconductor chip. This applies, in particular, with regard to the materials and process temperatures to be used.

In order that an area required for a solar cell is kept as small as possible, the radiation source or light source should have the highest possible energy density. Moreover, it should be adapted to the power characteristics of the solar cell. The radiation source may be realized for example by a UV light source or by a widened laser beam.

If the intention is to evaluate information about the performance of a functional test and/or a test result, then it is necessary for this to be transmitted likewise contactlessly to an external evaluation device, for example. In the simplest case, a test information item may be a "pass or fail" information item that states whether a tested semiconductor chip functions properly. Data to be evaluated may additionally contain information about the classification into a speed class or similar distinguishing criteria.

If a semiconductor chip to be tested can be repaired by the self-test unit, for example, by virtue of redundancy existing on the semiconductor chip, then it is advantageous to obtain more detailed information about a repair in order to be able to make statements about the defect density on the chip. Thus, for example in the case of the memory chip to be tested, the addresses of the defective memory cells can be determined and it is possible to evaluate how much of the existing redundancy was used for repair.

For the transfer and for the evaluation of test information about the performance of the test and/or a test result, in one embodiment of the invention, the semiconductor chip has a functional unit for the contactless transmission of data containing the test information to be read out.

For this purpose, the functional unit is configured for example to generate optical radiation pulses in accordance with the data to be transmitted. The radiation pulses can be received by a receiver outside the semiconductor chip. For this purpose, by way of example, a semiconductor laser is provided on the semiconductor chip, which generates corresponding radiation pulses. In this case, care should be taken to ensure adequate scattered-light shielding and calibration of the receiver when using a solar cell, in order to be able to reliably detect the signal to be read out under the illumination for the purpose of generating current. The semiconductor laser is provided for example in the place of a connecting pad of the chip. This pad must be kept free for the emission of the radiation. The radiation pulses to be emitted may be generated for example by laser light that radiates obliquely with respect to the surface of the semiconductor wafer.

In another embodiment of the invention, the functional unit has an output terminal, via which the data to be transmitted can be transmitted by capacitive coupling to a receiver outside the semiconductor chip. For this purpose, a test tip is placed opposite the output terminal, for example in the form of an output pad, at a comparatively short distance and the information to be transmitted is transferred by capacitive coupling. If the solar cell is disposed on that surface of a semiconductor wafer which faces the semiconductor chips to be tested, the configuration of the test tips must allow sufficient illumination of the wafer surface.

In another embodiment of the invention, a material, for example a semiconductor material, is connected to a terminal of the functional unit, at which a potential, which can be controlled by the functional unit, is present in accordance with the data to be transmitted. In this case, the material effects an optical refraction of incident optical radiation, which refraction can be controlled by the potential. For this purpose, the material is irradiated with optical radiation and the optical radiation refracted by the material is received by a receiver outside the semiconductor chip. Thus, changes in the refractive index of a corresponding material are effected by an electro-optical control by utilizing electrical leakage fields at the terminal of the functional unit. In this case, the refractive index changes on account of the potential present, which is controlled by the functional unit. The resulting different angles of refraction are evaluated by the receiver.

In order to start a transfer of the test information to be read out, in an advantageous embodiment the semiconductor chip has a voltage detector or a current detector, which is connected to the energy source and to the functional unit. When a characteristic voltage sequence or current sequence occurs, a data transmission is initiated by the functional unit. The requisite voltage or current intensity sequence is generated by a corresponding variation of the radiation intensity.

In a further embodiment, the voltage detector or the current detector is connected to the energy source and to the self-test unit, the beginning of a functional test by the self-test unit being initiated by a detected characteristic voltage sequence or current sequence.

A transfer of information from, for example, an external test device into a semiconductor chip to be tested at the beginning of a test run is not necessary. This information can be stored for example in a read only memory (ROM). The information is read in for a functional test by the self-test unit.

In a further embodiment of the invention, the semiconductor chip has a nonvolatile memory unit for storing data that contain information about the performance of the test and/or a test result. In order to read out these data, the nonvolatile memory unit is connected to a terminal of the semiconductor chip, via which the data of the memory unit can be tapped off to a point outside the semiconductor chip. This embodiment is particularly advantageous in the case of functional tests in which test information is read out to a limited extent. This information can be stored in a nonvolatile manner for example in electrically programmable fuses. This information can be read out in a next test step, for example during a module test which is carried out after a wafer test.

In a development of the semiconductor chip, the latter has an integrated memory containing memory cells that can be subjected to a functional test. For this purpose, the self-test unit is configured for generating test information and for carrying out a functional test of the memory cells. It generates the "test patterns and timings" required for a functional test.

If, in one embodiment, the integrated memory has not only normal memory cells but also redundant memory cells for replacing normal memory cells, then defective normal memory cells can be repaired. The functionality of the normal memory cells is checked by the self-test unit and then an analysis is performed as to which of the normal memory cells are to be replaced by which of the redundant memory cells. The repair information is thus generated by calculation from the defect picture determined for the memory. For this purpose, a corresponding redundancy algorithm is stored in a suitable manner in the self-test unit (for example in a ROM). After the determination of the repair information, the redundant memory cells are activated in accordance with the result of the analysis by the self-test unit. In a further embodiment, this activation can also be performed by electrically programmable memory units in which a repair result determined by the self-test unit can be programmed. The above-described repair of a memory chip can be applied in particular to "DRAMs" and "eDRAMs".

Other features which are considered as characteristic for the invention are set forth in the appended claims.

Although the invention is illustrated and described herein as embodied in a test configuration for the functional testing of a semiconductor chip, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE PREFERRED EMBODIMENT

Figure 1:
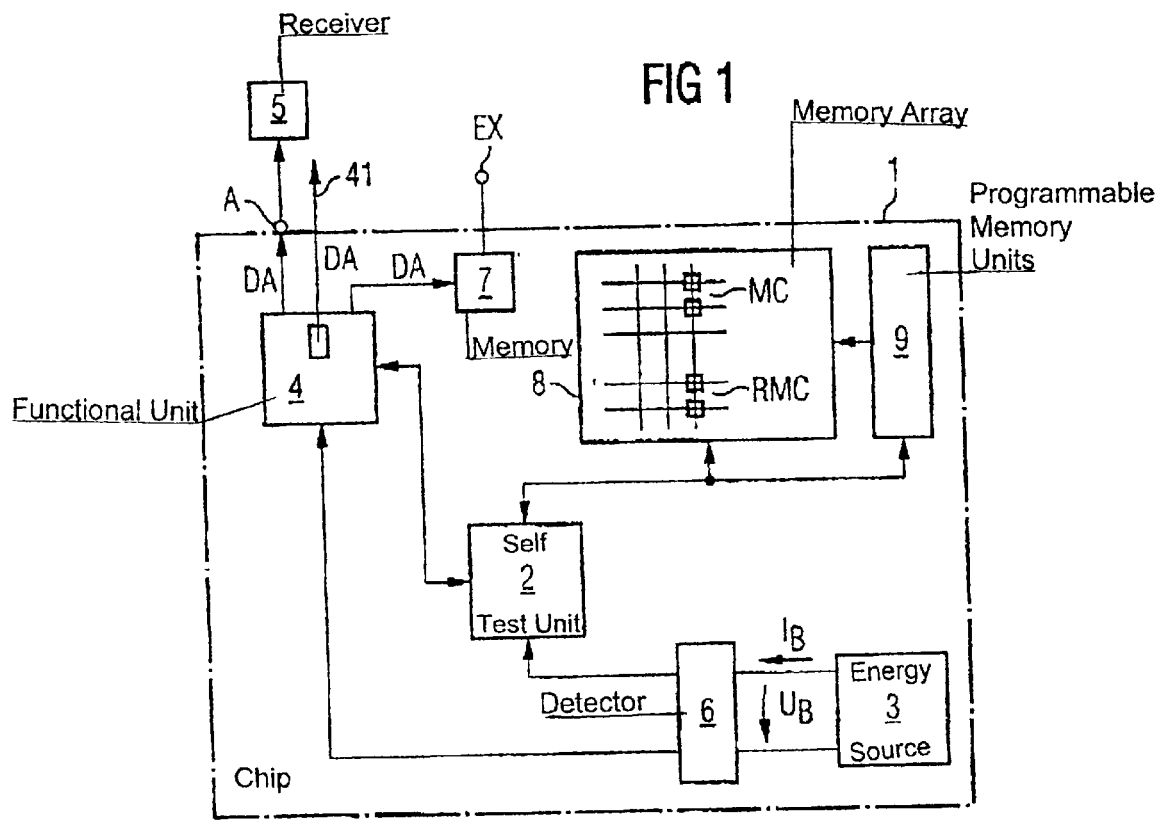
FIG. 1 is a block circuit diagram of an embodiment of a test configuration according to the invention.

In all the figures of the drawing, sub-features and integral parts that correspond to one another bear the same reference symbol in each case. Referring now to the figures of the drawing in detail and first, particularly, to FIG. 1 thereof, there is shown a semiconductor chip 1, which is embodied as an integrated memory 1 in this case. The memory 1 has a matrix-type memory cell array 8 with normal memory cells MC and redundant memory cells RMC for replacing defective normal memory cells MC, which are each disposed along column lines and row lines. The semiconductor chip 1 additionally has a self-test unit 2, also referred to as a built-in self-test (BIST), for generating test information and for carrying out a functional test of the normal memory cells MC. For this purpose, by way of example, test patterns are read into the memory cell array 8 and compared with data that are read out. In this case, the self-test unit 2 checks the functionality of the normal memory cells MC. The voltage levels of the drive signals are additionally generated by the self-test unit 2. The self-test unit 2 subsequently carries out an analysis as to which of the normal memory cells MC are to be replaced by which of the redundant memory cells RMC. The repair information is then stored.

For this purpose, the memory chip 1 has electrically programmable memory units 9, in which a repair result determined by the self-test unit 2 can be programmed. The electrically programmable memory units 9 are embodied for example as "electrical fuses", which can likewise be programmed by the self-test unit 2. By way of example, addresses of defective normal memory cells MC are stored in the memory units 9. For the replacement of defective normal memory cells MC, corresponding redundant memory cells RMC are activated by the memory units 9.

In order to provide an electrical energy supply on the semiconductor chip 1, an energy source 3 is provided, which provides an electrical energy supply from energy that is fed in contactlessly. In this exemplary embodiment, the energy source 3 is disposed on the semiconductor chip 1. The energy source 3 is connected to a voltage detector or current detector 6, which can detect a characteristic voltage sequence or current sequence of an operating voltage UB or of an operating current IB, respectively. The voltage detector or current detector 6 is connected to the self-test unit 2 for the purpose of initiating a functional test on account of a detected characteristic voltage sequence or current sequence.

Furthermore, the semiconductor chip 1 has a functional unit 4, which is configured for the contactless transmission of data DA which contain information about the performance of the test and/or a test result. The functional unit 4 contains a semiconductor laser, for example, which can generate optical radiation pulses 41 in accordance with data DA to be transmitted. The optical radiation pulses 41 are received by a receiver 5 outside the semiconductor chip 1. The functional unit 4 is connected to the self-test unit 2. Furthermore, the functional unit 4 is connected to the voltage detector or current detector 6, which initiates a data transmission by the functional unit 4 in the event of detection of a characteristic voltage sequence or current sequence.

In another embodiment, the functional unit 4 has an output terminal A, for example in the form of a terminal pad, via which the data DA to be transmitted are transmitted by capacitive coupling to the receiver 5. For this purpose, the receiver 5 has suitable test tips that are disposed at a sufficiently short distance from the terminal A.

Furthermore, the semiconductor chip 1 contains a nonvolatile memory unit 7 for storing the data DA. The memory unit 7 is connected to a terminal EX of the semiconductor chip. At the terminal EX, the stored data DA of the memory unit 7 are read out, for example, during a module test.

Figure 2:
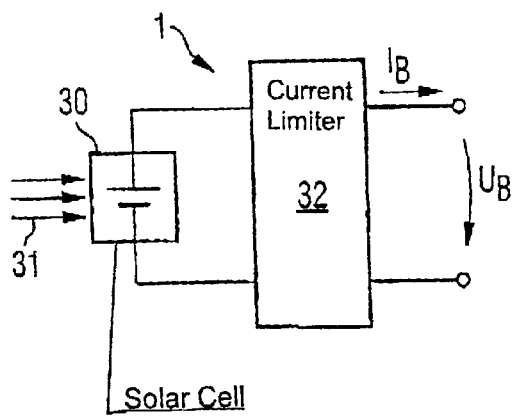
FIGS. 2 and 3 are block diagrams of further detailed embodiments of the test configuration.

FIG. 2 illustrates an embodiment of the test configuration as an electrical basic circuit diagram. The energy source 3 in this case has a solar cell 30, which can generate the operating current IB on the semiconductor chip 1 by optical radiation 31 that is fed in contactlessly. A current limiter circuit 32 is provided in the current path of the solar cell 30, which circuit 32 isolates the semiconductor chip 1 from the solar cell 30 in the event of a limit value of the operating current IB being exceeded. This is advantageous particularly when the solar cell 30 is used as a common energy source for a plurality of semiconductor chips 1 to be tested. Thus, in the event of a short circuit, for example, other semiconductor chips 1 to be tested are not affected since the defective chip is isolated from the energy supply by the current limiter circuit 32.

Figure 3:
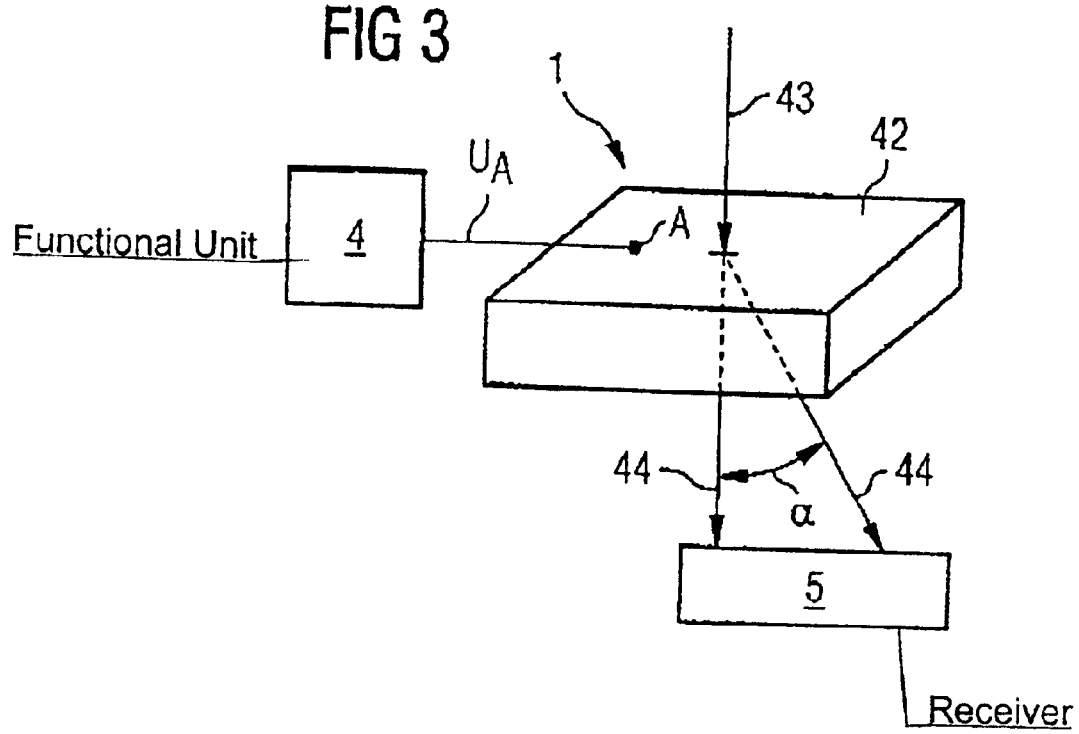

FIG. 3 illustrates a further embodiment of the test configuration. The semiconductor chip 1 has a material 42, which is irradiated with optical radiation 43. In this case, the optical refraction of the optical radiation 43 can be controlled by a potential UA. This results in different angles α of refraction of the refracted optical radiation 44. The refracted radiation 44 is received by the receiver 5 outside the semiconductor chip 1. The material 42 is connected to the terminal A of the functional unit 4, at which the potential UA is present. This potential can be controlled in accordance with the data DA to be transmitted. Therefore, the angle α of refraction is varied as a function of the data DA to be transmitted. Thus, electrical leakage fields at the terminal A are utilized by the potential UA present there by an electro-optical control.

Figure 4:
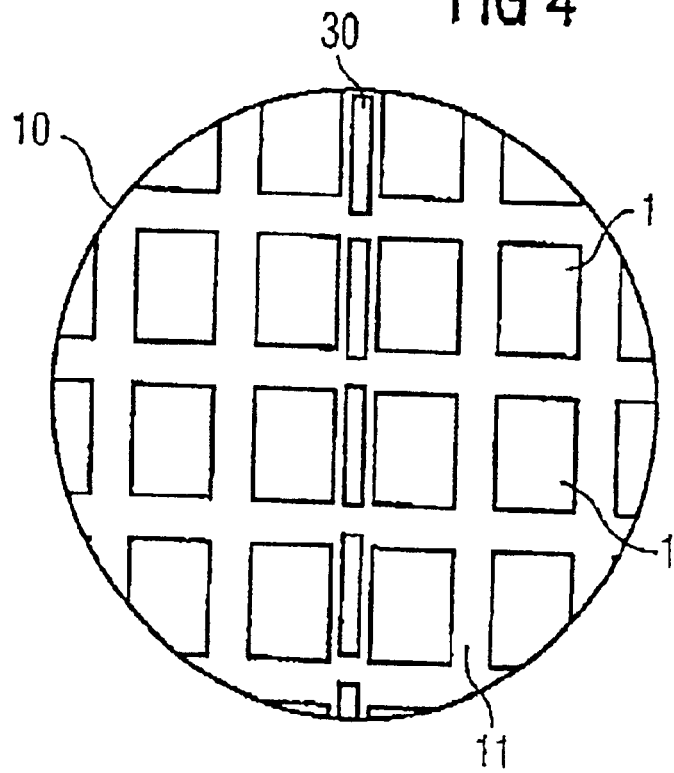
FIG. 4 is a plan view of a solar cell.

FIG. 4 shows an embodiment of a configuration of a plurality of the semiconductor chips 1, which are disposed on a support 10. The support 10 is configured as a semiconductor wafer 10 in FIG. 4. The semiconductor wafer 10 has a scribe line 11, in which the solar cells 30 are disposed. The semiconductor chips 1 are sawn out along the scribe line 11 at a later time during fabrication.

Figure 5A:
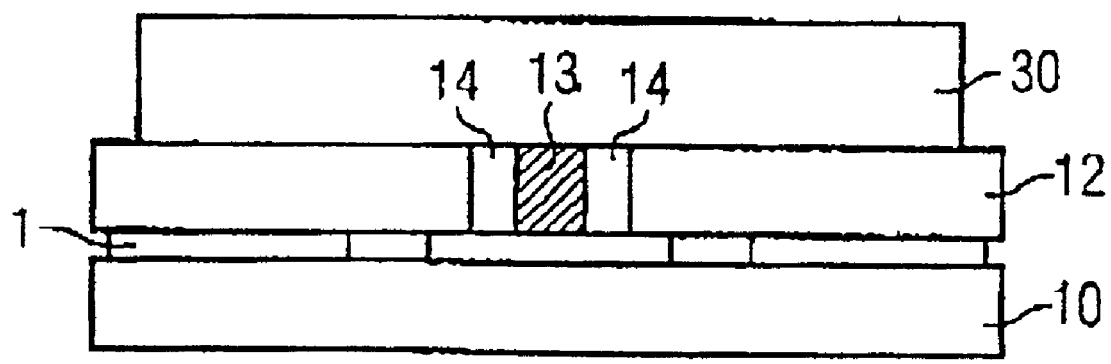
FIGS. 5a and 5b are sectional views of the solar cell.

FIG. 5a shows, in a further embodiment, a cross section of the configuration in which a plurality of the semiconductor chips 1 are disposed on the support or the semiconductor wafer 10. In this case, the solar cell 30 is disposed over the whole area on the surface of the semiconductor wafer 10. A radiation-absorbing layer 12 is applied between the solar cell 30 and the semiconductor wafer 10. In the case where the solar cell 30 transmits radiation downward to the semiconductor wafer 10, the radiation-absorbing layer 12 prevents charge carrier generation on the semiconductor chips 1.

Figure 5B:
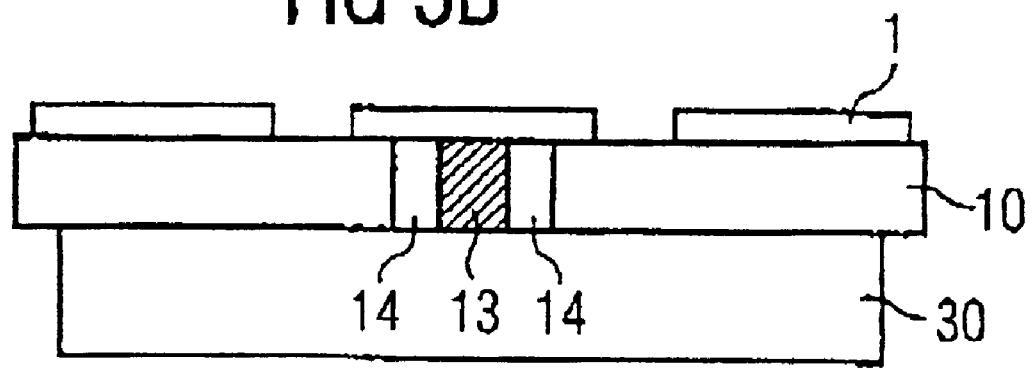

FIG. 5b shows, in a further embodiment, the configuration in which the solar cell 30 is disposed on a bottom surface of the support or of the semiconductor wafer 10, the surface being remote from the semiconductor chip 1. Disposed between the solar cell 30 and the respective semiconductor chip 1 there is an electrically conductive plated-through hole 13 in the substrate 10, shown by way of example on a single plated-through hole 13. At the boundary between the plated-through hole 13 and the substrate 10, a pn junction 14 is disposed along the plated-through hole 13. In this case, the pn junction 14 serves for preventing a current flow between the plated-through hole 13 and the substrate 10. The plated-through hole 13 and the pn junction 14 are disposed in a similar manner for the same purpose in the radiation-absorbing layer 12 in accordance with FIG. 5a. This layer may also additionally be provided in the configuration according to FIG. 5b.

We claim:

1. A test configuration, comprising:

a semiconductor wafer having a surface with an area;

a plurality of semiconductor chips disposed on said surface of said semiconductor wafer, each of said semiconductor chips having a self-test unit generating test information for functionally checking said semiconductor chip, said plurality of semiconductor chips having top surfaces; and an energy source disposed above said semiconductor wafer and connected to said semiconductor chip for providing an electrical energy supply to said semiconductor chip, said energy source having at least one solar cell for generating an operating current for said semiconductor chip by optical radiation fed in contactlessly, said solar cell being disposed entirely over said area of said surface of said semiconductor wafer and over said top surfaces of said semiconductor chips.

2. The test configuration according to claim 1, including a radiation-absorbing layer between said solar cell and said semiconductor wafer, said radiation-absorbing layer having an electrically conductive plated-through hole formed therein disposed between said solar cell and said semiconductor chip.

3. The test configuration according to claim 2, wherein said radiation-absorbing layer has a pn junction disposed along said plated-through hole at a boundary between said plated-through hole and said radiation-absorbing layer for preventing a current flow between said plated-through hole and a remainder of said radiation-absorbing layer.

4. The test configuration according to claim 1, wherein said semiconductor chip has a functional unit for a contactless transmission of data containing information about a test result.

5. The test configuration according to claim 4, including a receiver disposed separate from said semiconductor chip, said functional unit having an output terminal through which the data to be transmitted can be transmitted by capacitive coupling to said receiver.

6. The test configuration according to claim 4, wherein said semiconductor chip has a detector selected from the group consisting of voltage detectors and current detectors, said detector is connected to said energy source and to said functional unit for initiating a data transmission by said functional unit due to a detected characteristic voltage sequence or current sequence.

7. The test configuration according to claim 1, wherein said semiconductor chip has a terminal and a nonvolatile memory unit for storing data containing information about a test result, said nonvolatile memory unit being connected to said terminal through which the data of said nonvolatile memory unit can be tapped off to a point outside said semiconductor chip.

8. The test configuration according to claim 1, wherein one of said semiconductor chips is decoupled from respective others of said semiconductor chips with regard to said energy supply during a functional test.

9. The test configuration according to claim 1, wherein all of said semiconductor chips to be tested are connected to said energy source being a common energy source, each of said semiconductor chips has a current limiter circuit for electrically isolating a respective semiconductor chip from said common energy source in an event of a limit value of an operating current being exceeded.

10. The test configuration according to claim 1, wherein each of said semiconductor chips has an integrated memory containing memory cells to be subjected to a functional test, and said self-test unit generates test information and carries out a functional test of said memory cells.

11. The test configuration according to claim 10, wherein said integrated memory has normal memory cells and redundant memory cells for replacing said normal memory cells, and said self-test unit is configured for checking a functionality of said normal memory cells, for analyzing which of said normal memory cells are to be replaced by which of said redundant memory cells, and for activating said redundant memory cells in accordance with a result of the analysis.

12. The test configuration according to claim 11, wherein said integrated memory has electrically programmable memory units for activating said redundant memory cells, in which a repair result determined by said self-test unit can be programmed.

13. The test configuration according to claim 1, including a radiation-absorbing layer disposed between said solar cell and said semiconductor chip.

\* \* \* \* \*